United States Patent
Johann et al.

(10) Patent No.: US 8,520,392 B2
(45) Date of Patent: Aug. 27, 2013

(54) ELECTRONIC CONTROL UNIT AND METHOD FOR PRODUCING COMPONENT OF SAME

(75) Inventors: Christian Johann, Reutlingen (DE); Matthias Roder, Reutlingen (DE); Ruediger Laubenstein, Reutlingen (DE)

(73) Assignee: Automotive Lighting Reutlingen GmbH, Reutlingen (DE)

( * ) Notice: Subject to any disclaimer, the term of this patent is extended or adjusted under 35 U.S.C. 154(b) by 348 days.

(21) Appl. No.: 12/968,610

(22) Filed: Dec. 15, 2010

(65) Prior Publication Data

US 2011/0149522 A1 Jun. 23, 2011

(30) Foreign Application Priority Data

Dec. 22, 2009 (DE) .................. 10 2009 060 777

(51) Int. Cl.
*H05K 7/20* (2006.01)
*H05K 1/00* (2006.01)
*H05K 1/16* (2006.01)

(52) U.S. Cl.
USPC ........... 361/712; 361/704; 361/720; 361/749; 174/254; 174/252; 174/260

(58) Field of Classification Search
USPC ........... 361/70, 713, 714, 749, 750; 174/252, 174/254, 255, 260
See application file for complete search history.

(56) References Cited

U.S. PATENT DOCUMENTS

| | | | | |
|---|---|---|---|---|
| 5,434,362 A | * | 7/1995 | Klosowiak et al. | 174/254 |
| 5,998,738 A | * | 12/1999 | Li et al. | 174/250 |
| 6,292,370 B1 | * | 9/2001 | Anderson et al. | 361/748 |
| 6,927,344 B1 | * | 8/2005 | Gall et al. | 174/254 |
| 2005/0056457 A1 | * | 3/2005 | Gall et al. | 174/254 |
| 2005/0190531 A1 | | 9/2005 | Gall et al. | |
| 2006/0151201 A1 | * | 7/2006 | Kaply et al. | 174/255 |
| 2007/0212902 A1 | | 9/2007 | Clayton et al. | |
| 2008/0257587 A1 | * | 10/2008 | Su et al. | 174/254 |

FOREIGN PATENT DOCUMENTS

| | | |
|---|---|---|
| DE | 3936906 A1 | 5/1991 |
| DE | 19701854 C1 | 5/1998 |
| DE | 19851835 A1 | 5/1999 |
| DE | 10048379 A1 | 4/2001 |
| EP | 0 827 372 A2 | 3/1998 |
| WO | 93/11654 A1 | 6/1993 |

OTHER PUBLICATIONS

May 25, 2011 European Examination Report for Application No. 10014655.4-2210.

* cited by examiner

*Primary Examiner* — Zachary M Pape
(74) *Attorney, Agent, or Firm* — Howard & Howard Attorneys PLLC

(57) ABSTRACT

An electronic-control unit (7) includes a conductor board (12) made of a flexible substrate and defining at least one conducting path and cut (13) of the board (12). A basic body (11) is made of a thermally and electrically conductive material and thermally and electrically coupled to the board (12) and defines at least one elongated groove (15) that acts as a bending area (15) of the body (11) and expands over substantially an entire width of the body (11) in an aligned area of the cut (13) of the board (12) and a flat projection of the body (11) onto which the substrate is fastened. A basic-body-conductor-board unit is formed before the board (12) is assembled with at least one electronic component (16). The basic-body-conductor-board unit is re-shaped into a desired geometry after the assembly of the board (12) with the component (16). A method produces the basic-body-conductor-board unit.

15 Claims, 4 Drawing Sheets

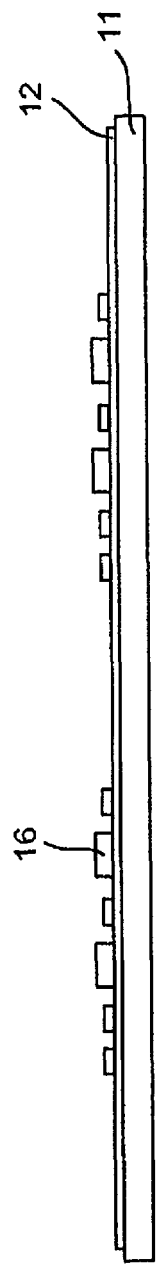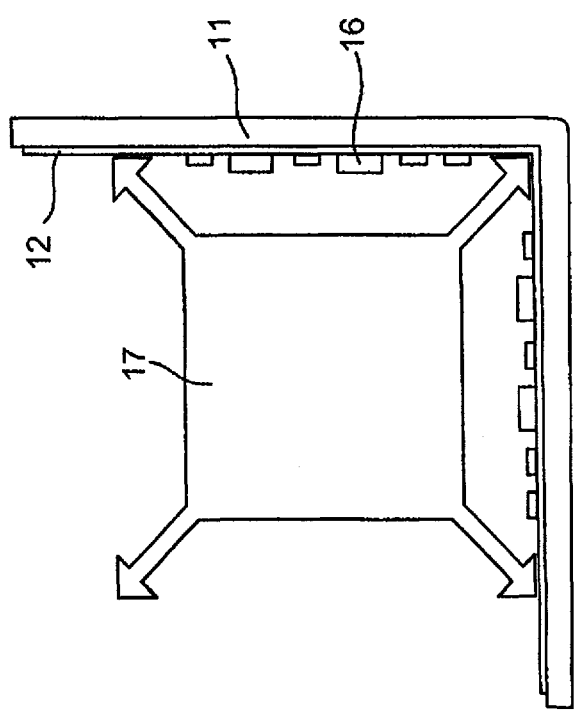

ELECTRONIC CONTROL UNIT AND METHOD FOR PRODUCING COMPONENT OF SAME

CROSS-REFERENCE TO RELATED APPLICATION

This application claims priority to and benefit of the filing date of German Patent Application 10 2009 060 777.3 entitled "Electronic Control Unit and Method for Producing a Unit Consisting of a Basic Body and a Conductor Board to be Used in Such a Control Unit" and filed on Dec. 22, 2009.

BACKGROUND OF INVENTION

1. Field of Invention

The invention relates, generally, to an electronic control unit and, more specifically, to such a unit employed with lighting equipment of a motor vehicle.

2. Description of Related Art

An electronic control unit, particularly in the area of motor vehicles, has to be placed in a control-unit box for protection from dirt, moisture, and outside mechanical effects. To improve "EMC" compatibility, this box consists partly of metal. This often leads to a conflict between a most compact geometry of the control unit, on the one hand, and prevention of heat accumulation in the inside of the box, on the other hand.

Use of flexible substrates for conductor-board materials is known from various applications. A conductor board is used, on the one hand, as a carrier and for mechanical fixture and, on the other hand, for applying electronic contact for electronic components. Nearly every electronic appliance—in particular, an electronic control unit—consists of one or more conductor boards. Stiff or inflexible conductor boards are used most cases.

As an alternative to inflexible conductor boards, it is more and more common to use thin, flexible conductor boards—for example, on a foundation of polyimide foils. Those so-called "flex circuits" can be re-shaped, for example, by folding of bending so that they fit in the narrowest structures, such as in cameras or camcorders. Yet, disadvantages of such flexible conductor boards are fairly high costs, poor thermal conductivity of heat produced by electrical components during operation, and missing mechanical-form stability of the conductor boards. Therefore, populating conductor foil using placement machines is made difficult, and it is very complicated to achieve mechanical stability of the assembled conductor boards, e.g., in the control-unit box.

In case there is need for only one part of the conductor board to be flexible (e.g., for making it possible to mount the board in very cramped conditions), there is a possibility to reduce thickness of a populated conductor board—e.g., by milling. A thinned area can, thus, be bent a few times. This technique leads to so-called "rigid-flex boards." A disadvantage of this technology is that each bending edge allows only for a one-dimensional re-shaping. Further, in cramped-space conditions, a fairly large bending radius is particularly disadvantageous as a lost populating area since it is only possible to populate components outside of a bending area.

Finally, there is a known construction to prevent the disadvantages when using known flex boards in that the assembled flexible conductor foil is fixed onto a solid basic board as foundation—e.g., by gluing these two together. However, disadvantageously, to make sure that there is no inappropriate material strain resulting from differing bending radii, it is necessary to suspend the solid basic board in the bending area. To ensure mechanical stability, it is necessary to strengthen construction with a further element. Further, assembly of this flexible conductor board with its lacking form stability proves to be complicated. Finally, fixing of the populated conductor board on the basic body is elaborate and complicated. The danger exists that some electronic components might be destroyed or loosen from the board during the process of fastening.

Due to thermal requirements and conditions while using electronic components, it is commonly necessary to cool the electronic components in a suitable way. This can be achieved by a mechanical connection to a cooling element, which will absorb heat and can dissipate it to a surrounding area.

Thus, there is a need in the related art for a unit that is made-up of a conductor board and basic body for a control unit and omits the disadvantages described above. More specifically, there is a need in the related art for such a unit that allows an optimal connection between heat-emitting components and cooling elements when using flexible conductor boards. There is a need in the related art for such a unit that also maximizes space and area on the conductor board available for arranging electric and electronic components in the control unit while achieving an improved thermal conductivity of components and three dimensionally shaped flexible conductor boards. There is a need in the related art for such a unit also of which area for populating electronic components is maximized while providing enough stability for surface-mounted components during assembly or using the control unit.

SUMMARY OF INVENTION

The invention overcomes the disadvantages in the related art in an electronic-control unit including a conductor board made of a flexible substrate and defining at least one conducting path and at least one cut of the conductor board. A basic body is made of a thermally and electrically conductive material and thermally and electrically coupled to the conductor board and defines at least one elongated groove that acts as a bending area of the basic body and expands over substantially an entire width of the basic body in a substantially aligned area of the cut of the conductor board and a flat projection of the basic body onto which the flexible substrate is fastened. A basic-body-conductor-board unit is formed before the conductor board is assembled with at least one electronic component. The basic-body-conductor-board unit is re-shaped into a desired geometry after the assembly of the conductor board with the electronic, component. The invention overcomes the disadvantages in the related art also in a method for producing the basic-body-conductor-board unit.

One advantage of the electronic control unit of the invention is that complex three-dimensional conductor-board shapes can be achieved.

Another advantage of the electronic control unit of the invention is that poor thermal conductivity, limited form stability, and difficult assembly with common placement machines can be omitted.

Another advantage of the electronic control unit of the invention is that high reliability when used in high temperatures and three-dimensional formability can be retained.

Another advantage of the electronic control unit of the invention is that the basic body is made of a material with a good thermal conductivity—e.g., metal—and, at the same time, functions as a cooling element that can dissipate the heat.

Another advantage of the electronic control unit of the invention is that an optimal thermal conductivity exists between the basic body and substrate.

Another advantage of the electronic control unit of the invention is that it is possible to impose pressure forces to the substrate or basic body when fastening the substrate onto the basic body without danger that any already populated components might be damaged since the components are only populated to the substrate afterward.

Another advantage of the electronic control unit of the invention is that issuance onto any of the electronic components of pressure needed to fasten the conductor board to the basic body can be avoided.

Another advantage of the electronic control unit of the invention is that "EMC" compatibility of the basic-body-conductor-board unit is improved.

Another advantage of the electronic control unit of the invention is that the basic-body-conductor-board unit is adequately stabilized to assemble "SMD" (surface-mounted device) components using a common placement machine and after the assembled basic-body-conductor-board unit has been placed into a control-unit box.

Another advantage of the electronic control unit of the invention is that there is no need for further construction elements for stabilizing the conductor board inside the control-unit box due to high form stability of the fully assembled and reshaped basic-body-conductor-board unit.

Another advantage of the electronic control unit of the invention is that the unit is kept sealed with respect to environmental influences (e.g., dirt and moisture) and electromagnetic radiation, particularly when the basic body is supposed to function as a control-unit housing or part thereof.

Another advantage of the electronic control unit of the invention is that good thermal conductivity between adjacent areas is ensured.

Other objects, features, and advantages of the invention will be readily appreciated as the same becomes better understood while reading the subsequent description taken in conjunction with the accompanying drawings.

BRIEF DESCRIPTION OF EACH FIGURE OF DRAWING OF INVENTION

FIG. 7 is a side view of a flat projection of a basic body with a conductor board on the flat projection according to another embodiment of the electronic control unit of the invention; and FIG. 8 is a side view of the basic body with the applied conductor board after reshaping thereof according to the embodiment of the electronic control unit of the invention shown in FIG. 7.

DETAILED DESCRIPTION OF EMBODIMENTS OF INVENTION

Figure 1:
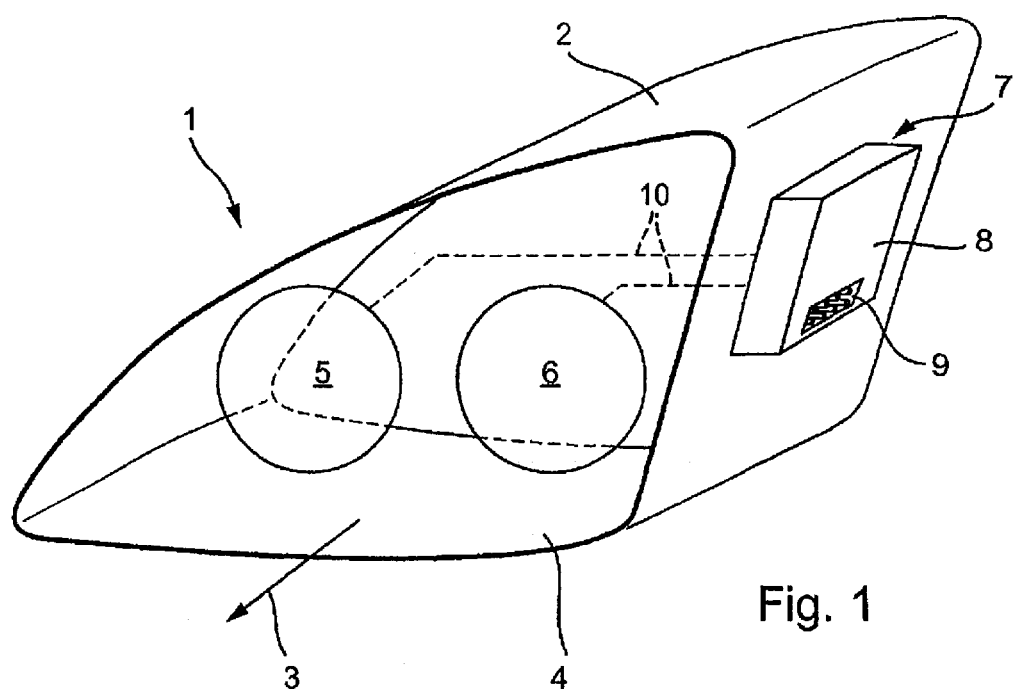
FIG. 1 is a perspective view of lighting equipment for a motor vehicle with which the electronic control unit of the invention is employed.

In FIG. 1, lighting equipment for a motor vehicle as a whole is generally indicated at 1. The lighting equipment 1 shown is a headlight. Of course, the lighting equipment 1 can be any lamp, such as a rear light. The headlight 1 includes a box or housing 2 that is made of plastic. In a direction that light is shining, generally indicated at 3, the box 2 has an opening for emitting light, which is sealed with a transparent cover glass 4. The cover glass 4 can have no optically active elements (e.g., prisms)—a so-called "clear glass." It is possible that the cover glass 4 is, to at least some extent, fitted with optically active elements so that, for example, light emitting through the cover glass 4 is spread in a horizontal direction. For a headlight, the cover glass 4 is made colorless. For a rear light, the cover glass 4 can be colored—in particular, red for a rear light, brake light, or fog light and/or yellow for an indicator light.

Inside the headlight housing 2, two light modules 5, 6 are arranged and create a certain light distribution. For a headlight, the light modules 5, 6 can be reflecting and/or projecting modules. A reflecting module includes at least one light source for emitting light and a reflector that reflects emitted light in such a way that there is a desired distribution of the light on a roadway in front of the motor vehicle. A projecting module includes at least one light source—a primary optics (e.g., a reflector or an optical head) for concentrating the light into a secondary optics (e.g., projector lenses) to project concentrated light onto the roadway in front of the vehicle to achieve a desired light distribution. In case the desired light distribution defines a light/dark boundary, the projecting module includes a screen arrangement between the reflector and a projector, an upper border of which is projected by the secondary optics onto the roadway as a light/dark boundary. Of course, it is possible for the light modules 5, 6 to include fiber-optic and/or other optical elements—in particular, when the lighting equipment 1 is a lamp. It is possible that the lighting equipment 1 includes greater or fewer than the two light modules 5, 6.

The light modules 5, 6 of the headlight 1 could produce, for example, a/an low-beam-headlight distribution, high-beam-headlight distribution, fog-light distribution, daytime-running-light distribution, positioning-light distribution, parking-light distribution, indicator-light distribution, city-light distribution, country-road-light distribution, highway-light distribution, static- or dynamic-curve-light distribution, or any other static or adaptive light distribution. The light modules 5, 6 can produce the desired light distribution either individually or by an interaction with each other or other light modules of the headlight 1. For lighting equipment used as a rear light 1, the light modules could produce a real-light distribution, brake-light distribution, fog-light distribution, indicator-light distribution, reversing-light distribution, or any other desired light distribution.

Positioned on the outside of the box 2 of the lighting equipment 1 is a control unit, generally indicated at 7, that includes a housing 8 made of metal—in particular, aluminum-pressure die casting. The control-unit housing 8 includes a plug or a socket 9 with which the control unit 7 can be connected to a power supply—e.g., a supply voltage of a battery of the vehicle and/or superior control unit (a body controller). The control-unit housing is located over an opening (not shown) in the headlight housing 2 through which cables 10 of the control unit 7 can run to the light modules 5, 6. To prevent moisture or dirt from reaching the inside of the headlight housing 2, the control-unit housing 8 is sealed toward the headlight housing 2—e.g., by using appropriate sealing methods (in particular, an elastic sealing lip). Of course, it is possible to locate the control unit 7 at another position on the outside of the headlight 1. Furthermore, it is possible that the control unit 7 is not located on the outside, but rather on the inside, of the housing 2 or at any other desired location separate from the headlight housing 2.

On the inside of the housing 8 are electronic components arranged on one or more conductor boards and connected to one another by conducting paths in such a way that the control unit 7 can produce the desired controlling and/or regulating functions in connection with operation of the lighting equipment 1. During operation of the control unit 7, the electronic components produce waste heat, which has to be dissipated from the inside to the outside of the housing 8 to prevent heat accumulation and a damaging or malfunctioning of the electronic components. At the same time, the control unit 7 should be as small and light as possible. This is accomplished through the control unit 7. For this, there is a conductor board on the inside of the housing 8 made of a flexible substrate, which is fixed onto a flat projection of a basic body before assembly of the electronic components. Following this, a unit consisting of the basic body and substrate (hereinafter referred to as "the basic-body-substrate unit") is then re-shaped into a desired geometrical form. In this way, it is possible to re-shape the basic-body-substrate unit in such a way that it utilizes space inside the housing 8 most efficiently.

Figure 2:
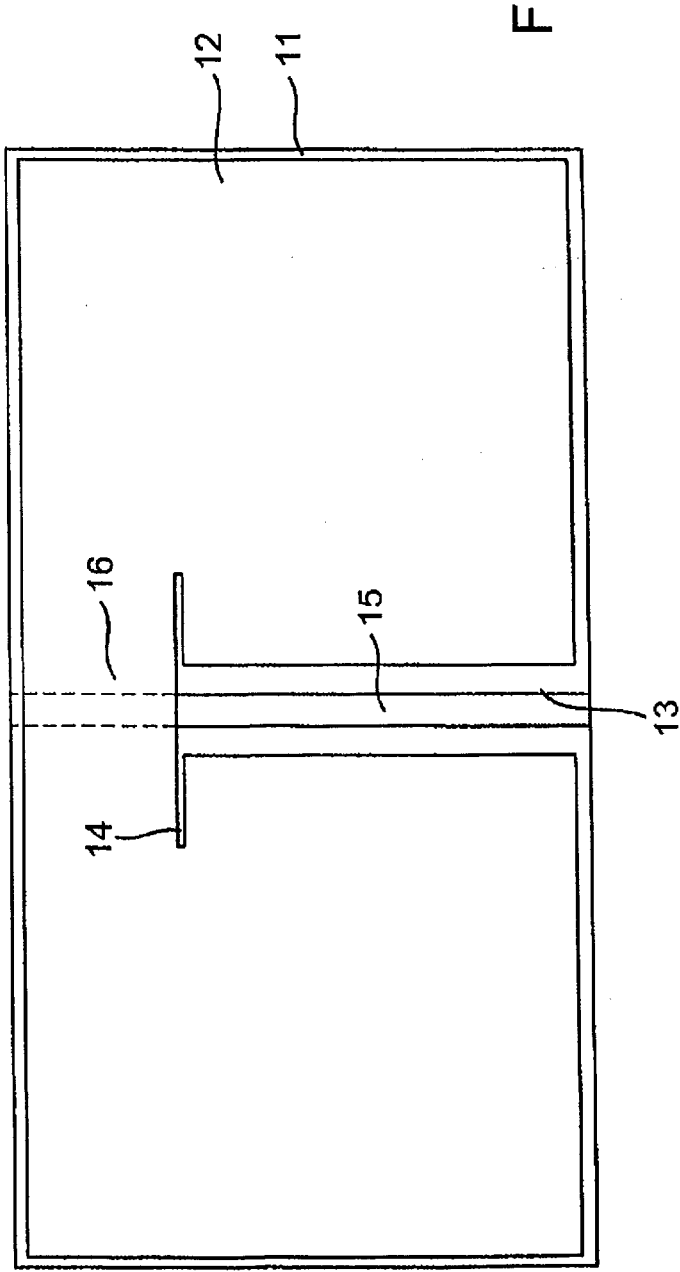
FIG. 2 is a top view of a flat projection of a basic body with a conductor board on the flat projection according to an embodiment of the electronic control unit of the invention.
Figure 3:
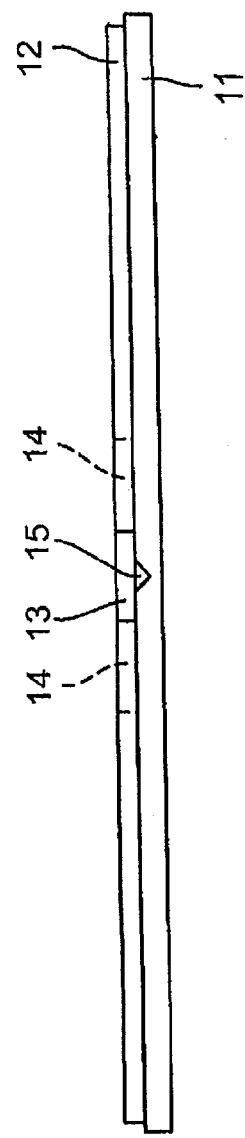
FIG. 3 is a side view of the flat projection of the basic body with the conductor board according to the embodiment of the electronic control unit of the invention shown in FIG. 2.

FIGS. 2 and 3 show the flat projection of the basic body 11 as a whole. The basic body 11 is generally rectangular without any slits or cuts. It is made of a material that can shield electromagnetic radiation well (e.g., metal). Furthermore, the material of the basic body 11 has good thermal conductivity. The basic body 11 serves to achieve mechanical stability, cooling of the flexible conductor board 12, and improvement of "EMC" compatibility of the control unit 7. The basic body 11 is bendable in order that the basic-body-substrate-unit, after being assembled with the electronic components, can be re-shaped into the desired form. It is possible that the re-shaped basic body 11 serves as part of the control-unit housing—e.g., being a removable cover to the housing 8. Hereto, the basic body 11 is sealed appropriately against the rest of the control-unit housing 8. Of course, it is possible that the basic body 11 makes up the entire control-unit housing 8.

The flexible conductor board 12 is fastened onto the basic body 11 before being assembled with the electronic components (e.g., by glue). Approximately in the center, the substrate 12 being fastened onto the basic body 11 has some T-shaped cuts 13, whereby crossbars of a T-shaped cut 13 are narrow slits 14. Furthermore, the basic body 11 is provided with an elongated groove 15, which expands over an entire width of the basic body 11 in an area of the cuts 13. The groove 15 can be on the outside and/or inside of the basic body 11 and is triangular when viewed in cross-section. Of course, the groove 15 can be any other desired shape—e.g., a circular segment (compare with FIG. 5). After fixing the substrate 12 to the basic body 11, assembly of the electronic components can take place using a common placement machine. Since the conductor board 12 is fixed onto the basic body 11, the conductor board now provides form stability needed for automatic assembly.

It is possible that the substrate 12 is not fixed over an entire area to the basic body 11. Thus, it is possible that the substrate 12 is not fastened to the basic body 11 in an area 16 above the groove 15 and next to it. When the basic-body-substrate unit is being re-shaped along the groove 15 toward the inside (compare with FIG. 4), it is possible that the substrate can loosen itself from the basic body 11 in the area 16 above the groove 15 and next to it. In this way, the substrate 12 can follow a bending course of the basic body 11 in a larger radius, which prevents the substrate 12 from being damaged in a bending area. Geometry of the conductor board 12 and carrier 11 is chosen such that that a bending with a small radius can be achieved while making sure that mechanical resilience is maintained. In the bending area 15, the conductor board is, thus, suspended. At the same time, the bending area 15 and conductor board 12, which is not fixed to the basic body 11, form a dedicated transition area 12' with a lager bending radius, whereas part of the bending of the conductor material 12 can go in an opposite direction to that of the basic body 11. The conductor material is bent such that permitted bending radii are kept. Thus, in the bending area 15, the conductor board 12' uses a little portion of the defined space created between both sides of the basic body 11. This poses no problem since the conductor board 12' is flexible and can be brought into a desired shape and position where it does not obstruct remaining components.

Shaping into the desired geometry is done after assembly of the electronic components. By an appropriate choice of the substrate 12 (arrangement, material, geometry, etc.), a suitable design of the basic body 11 (lesser material strength in the area of the bending edges 15 on the outside or inside of the body 11), and bending parameters (radius, bending forces, etc.), it is possible to get the flat projection 11 into the desired shape. The groove 15 in the forming area 16 helps to improve formability of the carrier material 11. Hereby, the groove 15 should only be as deep such that adequate rest stability of the remaining carrier material 11 can be maintained. Alternatively, it is possible to shape the carrier material 11 in the bending area 15 so that a mechanical load of the conductor material 12 is reduced.

Figure 4:
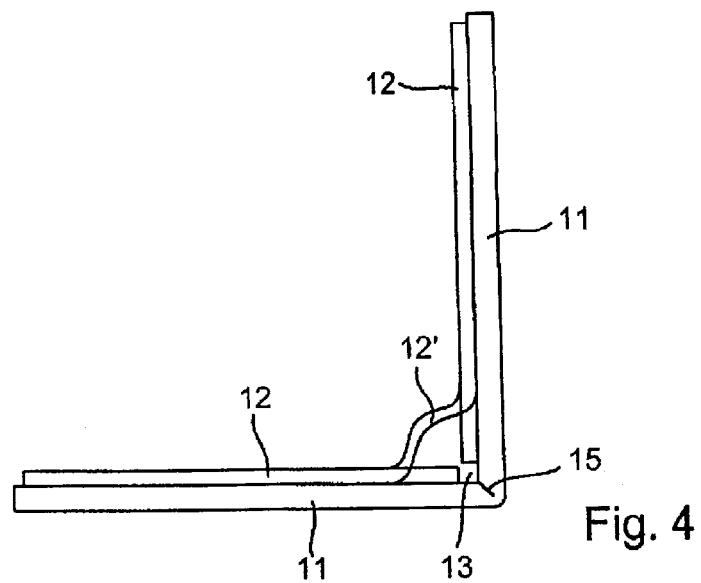
FIG. 4 is a side view of the basic body with the applied conductor board after reshaping thereof according to the embodiment of the electronic control unit of the invention shown in FIGS. 2 and 3.
Figure 5:
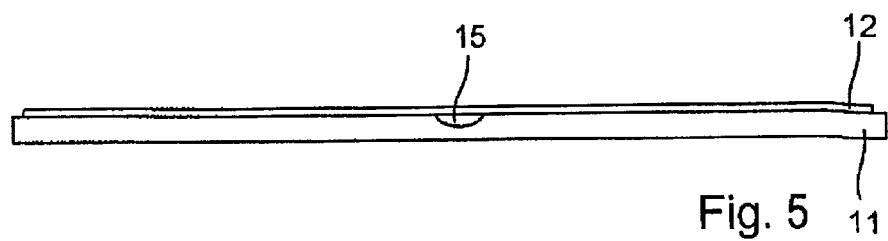
FIG. 5 is a side view of a flat projection of a basic body with a conductor board on the flat projection according to another embodiment of the electronic control unit of the invention.
Figure 6:
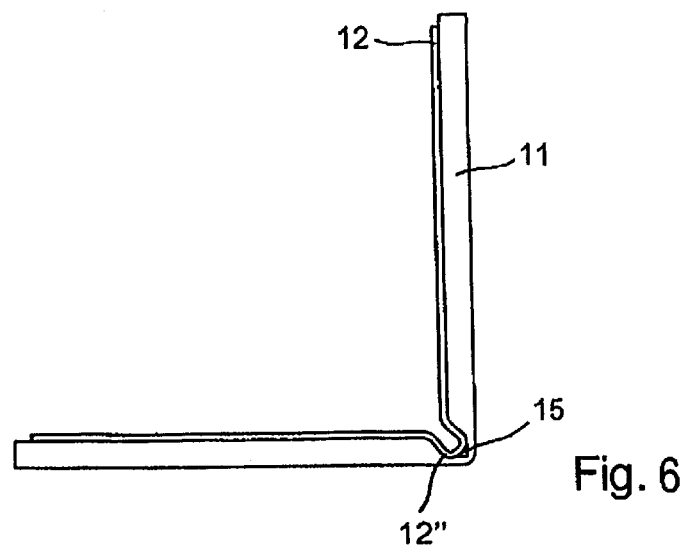
FIG. 6 is a side view of the basic body with the applied conductor board after reshaping thereof according to the embodiment of the electronic control unit of the invention shown in FIG. 5.

An embodiment shown in FIG. 5 differs from embodiments shown in FIGS. 2 to 4, particularly in form and dimension of the groove 15. This one is circular (e.g., semi-circular). Further, the flexible conductor board 12 is fasted to the basic body 11 right next to the groove 15 (e.g., by gluing). While re-shaping the basic body 11 along the groove 15, the part 12" of the conductor board 12, which originally was located above the groove 15, is now extended into the groove (compare with FIG. 6). When glue is applied into the groove before the shaping, the conductor board 12" is even glued inside the groove 15 in a re-shaped position of the basic body 11, which provides the re-shaped basic-body-substrate unit with further stability. Additionally, in the bending area 15, the conductor board 12 does not use any additional space of the defined space created by the two sides of the basic body 11. Rather, the groove in the bending area 15 takes up the conductor board 12".

An embodiment of shaping the basic-body-substrate unit assembled 16 with electronic components is shown in FIGS. 7 and 8. The carrier material 11 with the fixed (e.g., glued-on) conductor foil 12 and assembled electronic components 16 is bent around a forming body 17. By this, improper shaping of the conductor-board material 12 as well as damaging of the components can be prevented.

The invention been described in an illustrative manner. It is to be understood that the terminology that has been used is intended to be in the nature of words of description rather than of limitation. Many modifications and variations of the invention are possible in light of the above teachings. Therefore, within the scope of the appended claims, the invention may be practiced other than as specifically described.

What is claimed is:

1. An electronic control unit (7) comprising: a conductor board (12) made of a flexible substrate and defining at least one conducting path and at least one cut (13) of said conductor board (12), said cut comprising a first elongated portion which extends from an edge of the conductor board and terminates at a second slit portion which is perpendicular to the first elongated portion, the first elongated portion and second slit portion defining a T shape; and a basic body (11) made of a thermally and electrically conductive material, thermally and electrically coupled to said conductor board (12), and defining at least one elongated groove (15) that acts as a bending area (15) of said basic body (11) and expands over substantially an entire width of said basic body (11) and is substantially aligned under of said cut (13) of said conductor board (12) and a flat projection of said basic body (11) onto which said flexible substrate is fastened, wherein a basic-body-conductor-board unit is formed before said conductor board is assembled with at least one electronic component (16) and said basic-body-conductor-board unit is re-shaped into a desired geometry after said assembly of said conductor board (12) with said electronic component (16).

2. An electronic control unit (7) as set forth in claim 1, wherein, said flexible substrate is fastened onto said flat projection by gluing.

3. An electronic control unit (7) as set forth in claim 1, wherein said basic body (11) of said re-shaped basic-body-conductor-board unit is at least one part of a control-unit housing (8).

4. An electronic control unit (7) as set forth in claim 1, wherein said bending area (15) of said basic body (11) is weaker compared with a remainder of said basic body (11).

5. An electronic control unit (7) as set forth in claim 4, wherein said flexible substrate is at least partly suspended in said bending area (15).

6. An electronic control unit (7) as set forth in claim 4, wherein said flexible substrate defines a larger bending radius than that of said basic body (11) in an area of said bending area (15).

7. An electronic control unit (7) as set forth in claim 1, wherein said electronic control unit (7) is employed with lighting equipment (1) of a motor vehicle.

8. A method for producing a basic-body-conductor-board unit for use in an electronic control unit (7), said method comprising steps of: making a conductor board (12) of a flexible substrate; defining at least one conducting path and at least one cut (13) of said conductor board (12), said cut comprising a first elongated portion which extends from an edge of the conductor board and terminates at a second slit portion which is perpendicular to the first elongated portion, the first elongated portion and second slit portion defining a T shape; making a basic body (11) of a thermally and electrically conductive material; thermally and electrically coupling said basic body (11) to said conductor board (12); defining at least one elongated groove (15) that acts as a bending area (15) of said basic body (11) and expands over substantially an entire width of said basic body (11) in an aligned area under said cut (13) of said conductor board (12) and a flat projection of said basic body; fastening said flexible substrate onto said flat projection such that a basic-body-conductor-board unit is formed before assembling said conductor board with at least one electronic component (16); and re-shaping said basic-body-conductor-board unit into a desired geometry after said assembly of said conductor board (12) with said electronic component (16).

9. A method for producing a basic-body-conductor-board unit as set forth in claim 8, wherein said basic-body-conductor-board unit is re-shaped around a forming body (17).

10. A method for producing a basic-body-conductor-board unit as set forth in claim 8, wherein said flexible substrate is fastened onto said flat projection by gluing.

11. A method for producing a basic-body-conductor-board unit as set forth in claim 8, wherein said basic body (11) of said re-shaped basic-body-conductor-board unit is at least one part of a control-unit housing (8).

12. A method for producing a basic-body-conductor-board unit as set forth in claim 8, wherein said bending area (15) of said basic body (11) is weaker compared with a remainder of said basic body (11).

13. A method for producing a basic-body-conductor-board unit as set forth in claim 12, wherein said method comprises further a step of at least partly suspending said flexible substrate in said bending area (15).

14. A method for producing a basic-body-conductor-board unit as set forth in claim 12, wherein said method comprises further a step of defining a larger bending radius of said flexible substrate than that of said basic body (11) in an area of said bending areas (15).

15. A method for producing a basic-body-conductor-board unit as set forth in claim 8, wherein said method comprises further a step of employing said electronic control unit (7) with lighting equipment (1) of a motor vehicle.

* * * * *